United States Patent
Yang et al.

(10) Patent No.: US 8,397,139 B1
(45) Date of Patent: Mar. 12, 2013

(54) METHOD AND APPARATUS FOR PROCESSING NUISANCE DATA

(75) Inventors: Xueshi Yang, Cupertino, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 589 days.

(21) Appl. No.: 12/643,834

(22) Filed: Dec. 21, 2009

Related U.S. Application Data

(60) Provisional application No. 61/151,000, filed on Feb. 9, 2009.

(51) Int. Cl.
*H03M 13/00* (2006.01)
(52) U.S. Cl. .................................................. 714/777
(58) Field of Classification Search .................. 714/763, 714/773, 777
See application file for complete search history.

(56) References Cited

U.S. PATENT DOCUMENTS

| | | | | |
|---|---|---|---|---|
| 4,701,909 A | * | 10/1987 | Kavehrad et al. | 370/446 |
| 5,856,986 A | * | 1/1999 | Sobey | 714/744 |
| 6,185,717 B1 | * | 2/2001 | Fukunaga et al. | 714/777 |
| 6,381,713 B1 | * | 4/2002 | Irvin et al. | 714/701 |
| 7,149,955 B1 | * | 12/2006 | Sutardja et al. | 714/809 |
| 2008/0031284 A1 | * | 2/2008 | Alderson et al. | 370/503 |

* cited by examiner

*Primary Examiner* — Scott Baderman
*Assistant Examiner* — Joseph Kudirka

(57) ABSTRACT

A memory device having a plurality of nonvolatile memory cells for storing stored data where the stored data includes user stored data and nuisance stored data. A memory controller includes a transmitter for transmitting write data for storage as the stored data in the memory. The transmitter includes a selector for selection of user write data for storage as the user stored data in the memory and for selection of nuisance write data for storage as the nuisance stored data in the memory. The memory controller includes a receiver for receiving the stored data from the memory as read data where the read data includes the user stored data and the nuisance stored data. The receiver includes a Hamming weight detector for detecting the Hamming weights of read data received from the memory for distinguishing user stored data from nuisance stored data.

22 Claims, 3 Drawing Sheets

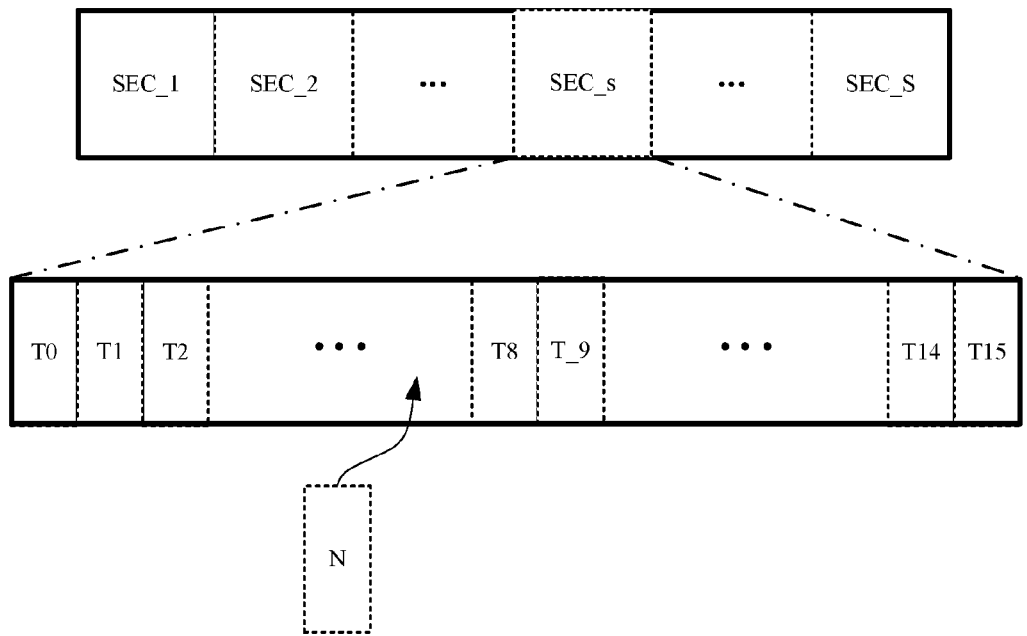
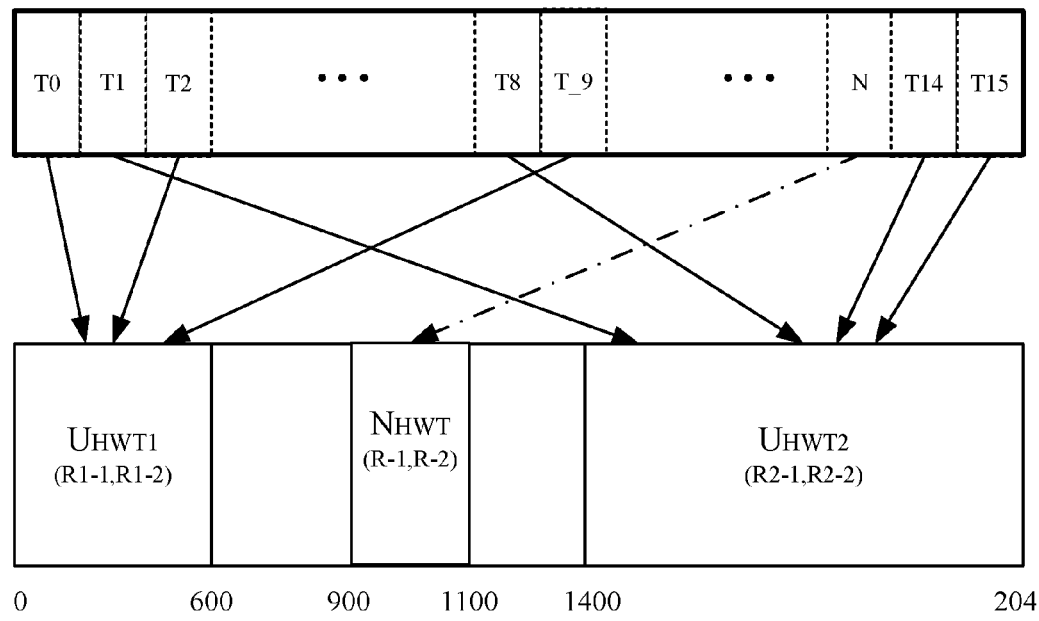

METHOD AND APPARATUS FOR PROCESSING NUISANCE DATA

CROSS-REFERENCED APPLICATIONS

This application claims the benefit under 35 USC 119(e) of Provisional Patent Application U.S. Ser. No. 61/151,000 entitled METHODS AND SYSTEMS FOR INSERTING AND DETECTING NUISANCE DATA IN A DATA STREAM filed Feb. 9, 2009; Inventors: Xueshi Yang and Gregory Burd. Application U.S. Ser. No. 61/151,000 is hereby incorporated by reference in its entirety in the present specification.

BACKGROUND OF THE INVENTION

This invention relates to memory devices and particularly to flash memory devices. Flash memory devices are provided as storage in personal digital assistants, laptop and other computers, digital audio players, digital cameras, mobile phones and other electronic devices.

Flash memory is a type of EEPROM (Electrically Erasable Programmable Read-Only Memory). EEPROM flash memories are formed by arrays of semiconductor memory cells. Each of the memory cells includes a floating gate field-effect transistor having an electrically isolated gate (floating gate) capable of holding a charge. The data in a cell is determined by the presence or absence of the charge on the floating gate. Charges are transported to or removed from the floating gate by specialized programming and erase operations. Flash memory is non-volatile because no power is needed to maintain the charge on the floating gates and hence no power is needed to maintain the stored information. Write fatigue of floating gate memory cells can occur after repetitive writes and erasures so that the memory cells do not properly have the correct charges and hence cause errors in the stored data.

For reading and writing of data from and to a flash memory, the cells are accessed on a random access basis to change the charge or read the charge on the floating gates. For erasing data from a flash memory, cells are grouped into sections called "erase blocks". The charge is removed from the floating gates by block erase operations in which all floating gate memory cells in the erase block are erased in a single erase operation. In flash memory devices, a block can be written with new data only when the block is in the Erased State. Therefore, before a block can be written with new data, the block has to be erased to the Erased State. In the Erased State, all the bits in the block have the same logical state, typically a logical value of "1" so that the Erased State is an all 1's state.

A flash memory device contains multiple logically addressable pages. Commonly used flash devices have 4KByte pages and 512KByte erasable blocks. For example, pages that store between 512 bytes of data and 8K bytes of data have between 512×8 bit cells and 8K×8 bit cells.

In storage systems including flash memory devices, embedded operating systems (OS) manage the data stored in the flash memory devices and maintain records of which pages are available to store new data. Data is stored in the memory using coding.

In one example, BCH coding is used for flash memories. BCH coding uses codes that are a class of parameterized, error-correcting codes which are easily decoded using syndrome receiving. Syndrome receiving is desirable since it is easily implemented with simple electronic hardware. As a class of codes, BCH codes are highly flexible and allow control over block length and acceptable error thresholds. Custom BCH codes can be easily designed according to well-known mathematical constraints. BCH codes have a code length, N, and have a correction power, T.

In flash memory, the data stream includes user data and non-user data. The non-user data is for control (such as data preambles) and other functions and is identified as "nuisance data". Conventionally, synchronization marks are embedded by the transmitter into the data stream stored into the memory in order to identify the difference between user data and nuisance data. The receiver of the data read from the memory detects the synchronization marks so that the receiver can identify where the user data starts and ends. In actual operation, however, synchronization marks have been unreliable due to errors that occur in the data streams. Such errors interfere with detection of the synchronization marks. Also, the reliability of synchronization marks is reduced when the synchronization mark pattern appears in the data stream as part of user data. While synchronization marks can be expanded in size so as to be more reliably detected, such expansion interferes with the limited space available for synchronization marks and reduces the capacity and efficiency of the memory.

In consideration of the above background, it would be desirable to provide flash memory devices that have improved methods and apparatus for distinguishing between user data and nuisance data.

SUMMARY

A memory device and method includes a memory having a plurality of nonvolatile memory cells for storing stored data. The memory cells are addressable for reading and writing stored data where the stored data includes user stored data and nuisance stored data. The memory device includes a memory controller. The memory controller includes a transmitter for transmitting write data for storage as the stored data in the memory. The transmitter includes a selector for selection of user write data for storage as the user stored data in the memory and for selection of nuisance write data for storage as the nuisance stored data in the memory. The memory controller includes a receiver for receiving the stored data from the memory as read data where the read data includes the user stored data and the nuisance stored data. The receiver includes a Hamming weight detector for detecting the Hamming weights of read data received from the memory where the Hamming weights are used to distinguish user stored data from nuisance stored data.

In embodiments, the Hamming weight detector is a count detector for counting 1's or 0's in the read data to determine the Hamming weights.

In embodiments, the nuisance stored data has a nuisance Hamming weight threshold, $N_{HWT}$, and the user stored data has a user Hamming weight threshold, $U_{HWT}$, wherein the nuisance Hamming weight threshold, $N_{HWT}$, is substantially different from the user Hamming weight threshold, $U_{HWT}$, to enable the Hamming weight detector to distinguish the user stored data from the nuisance stored data.

In embodiments, the nuisance Hamming weight threshold, $N_{HWT}$, is a first value and the user stored data Hamming weight threshold, $U_{HWT}$, is a second value wherein the first value is high and the second value is low or wherein the first value is low and the second value is high.

In embodiments, the nuisance stored data has a nuisance Hamming weight threshold, $N_{HWT}$, and the user stored data has a user Hamming weight threshold, $U_{HWT}$, and wherein the Hamming weight detector has a detection Hamming weight threshold, $D_{HWT}$, such that $N_{HWT} < D_{HWT} \leq U_{HWT}$.

In embodiments, the nuisance stored data has a nuisance Hamming weight threshold range, $N_{HWT}(R1,R2)$, and the user stored data has a user Hamming weight threshold range, $U_{HWT}(R1,R2)$, and wherein the Hamming weight detector has a detection Hamming weight threshold range, $D_{HWT}(R1, R2)$, such that, $N_{HWT}(R1,R2) < D_{HWT}(R1,R2) < U_{HWT}(R1,R2)$ or in an alternate embodiment such that, $N_{HWT}(R1,R2) > D_{HWT}(R1,R2) > U_{HWT}(R1,R2)$.

In embodiments, the nuisance Hamming weight threshold range, $N_{HWT}(R1,R2)$, the user Hamming weight threshold range, $U_{HWT}(R1,R2)$, and the detection Hamming weight threshold range, $D_{HWT}(R1,R2)$, are selected such that the probability is very low that user stored data is erroneously detected as nuisance stored data or that nuisance stored data is erroneously detected as user stored data. Accordingly, the probability is very low that the user stored data is confused with the nuisance stored data. The user Hamming weight threshold range, $U_{HWT}(R1,R2)$, and the detection Hamming weight threshold range, $D_{HWT}(R1,R2)$, are selected such that the user stored data is distinguished from the nuisance stored data.

In embodiments, the nuisance stored data has a nuisance Hamming weight threshold range, $N_{HWT}(R1,R2)$, the user stored data has a first user Hamming weight threshold range, $U_{HWT1}(R1-1,R1-2)$ and a second user Hamming weight threshold range, $U_{HWT2}(R2-1,R2-2)$, and wherein the Hamming weight detector uses the nuisance Hamming weight threshold range, $N_{HWT}(R1,R2)$, to distinguish the nuisance stored data from the user stored data with $U_{HWT1}(R1-1,R1-2) < N_{HWT}(R-1,R-2) < U_{HWT2}(R2-1,R2-2)$.

In embodiments, the nuisance Hamming weight threshold range, $N_{HWT}(R1,R2)$, the first user Hamming weight threshold range, $U_{HWT1}(R1-1,R1-2)$, and the second user Hamming weight threshold range, $U_{HWT2}(R2-1,R2-2)$, are selected such that the probability is very low that user stored data is erroneously detected as nuisance stored data or that nuisance stored data is erroneously detected as user stored data. Accordingly, the probability is very low that user stored data is confused with nuisance stored data. The first user Hamming weight threshold range, $U_{HWT}(R1-1,R1-2)$, and the second user Hamming weight threshold range, $U_{HWT2}(R2-1,R2-2)$, are selected such that the user stored data is distinguished from the nuisance stored data.

In embodiments, the stored data is organized in blocks wherein blocks for user stored data have a user data Hamming weight threshold, $U_{HWT}$; blocks for nuisance stored data have a nuisance Hamming weight threshold, $N_{HWT}$; the user Hamming weight threshold, $U_{HWT}$, is substantially different from the nuisance Hamming weight threshold, $N_{HWT}$; the Hamming weight detector has a detection Hamming weight threshold, $D_{HWT}$, having a value between the user Hamming weight threshold, $U_{HWT}$, and the nuisance Hamming weight threshold, $N_{HWT}$. For each block, the Hamming weight detector detects a block Hamming weight of the block and compares the block Hamming weight with the detection Hamming weight threshold, $D_{HWT}$, whereby for a block Hamming weight less than (or alternatively greater than) $D_{HWT}$, the block is a nuisance block and whereby for a block Hamming weight greater than (or alternatively less than) $D_{HWT}$, the block is a user block.

The foregoing and other objects, features and advantages of the invention will be apparent from the following detailed description in conjunction with the drawings.

BRIEF DESCRIPTION OF THE DRAWINGS

FIG. 3 depicts a block diagram representation of data used in the flash memory device of FIG. 1.

FIG. 4 depicts a block diagram representation of multiple Hamming weights used in the flash memory device of FIG. 1.

DETAILED DESCRIPTION

Figure 1:
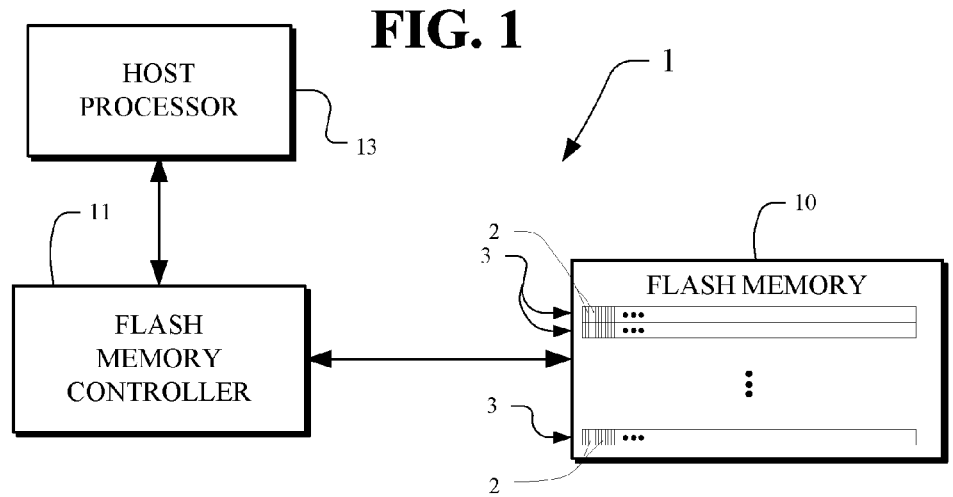
FIG. 1 depicts a block diagram of a flash memory device having a flash memory controlled by a flash memory controller.

FIG. 1 depicts a block diagram of a flash memory device 1 having a flash memory 10 controlled by a flash memory controller 11 and a host processor 13. The flash memory 10 has a plurality of nonvolatile memory cells 2 organized in a plurality of blocks 3. User data is written into and read from groups of the cells 2 in the flash memory 10 under control of the flash memory controller 11 and host processor 13.

Figure 2:
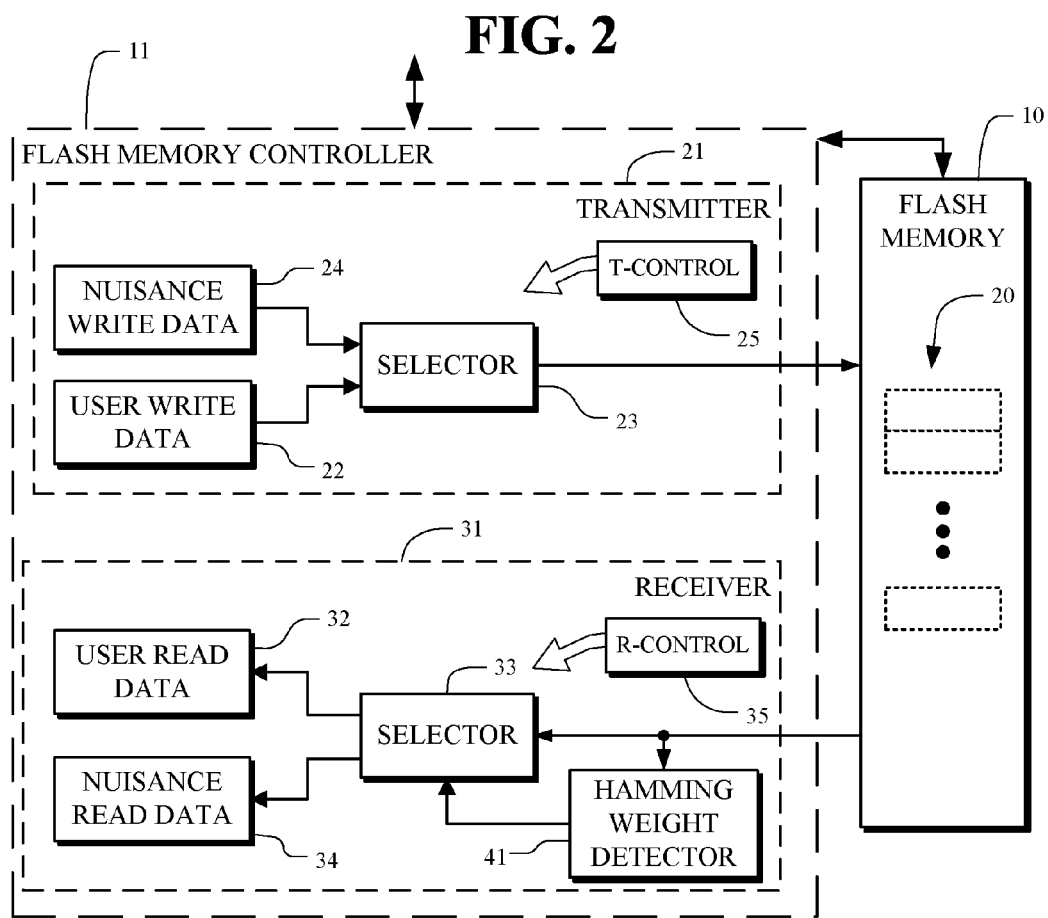
FIG. 2 depicts a block diagram of a flash memory device of FIG. 1 with further details of the flash memory controller.

FIG. 2 depicts a block diagram of further details of the flash memory controller 11 connected to the flash memory 10 of FIG. 1. The memory controller 11 controls the writing of write data to and the reading of read data from the flash memory 10. The write data and the read data include user data and nuisance data. The write data written to and the read data read from the memory 10, including the user data and the nuisance data, comprise the stored data 20 in the memory 10.

The memory controller 11 includes a transmitter 21 for transmitting user write data, in a register 22, and nuisance write data, in a register 24, to the memory 10 for storage as stored data 20. The transmitter 21 includes a selector 23 for selecting user write data from the register 22 and nuisance write data from register 24 to form the sequence of the user data and the nuisance data transmitted and stored in memory 10 as the stored data 20. The unit of organizing data in the transmitter 21 is a block where each block is either filled with user data or is filled with nuisance data. In one example, BCH15 code words are used as the coding for data stored and read from memory 10. The transmitter 21 includes a transmitter control 25 that operates under control of the host processor 13 to align the data in blocks for transmission in the flash memory controller 11.

The memory controller 11 includes a receiver 31 for receiving the stored data from the memory 11 as read data. The receiver 31 includes a selector 33 for selecting between user read data and nuisance read data from the read data that is read from the memory 10 to store the user read data in the register 32 and to store the nuisance read data in the register 34. The selector 33 operates under control of the Hamming weight detector 41 to select between the user read data and the nuisance read data. Hamming weight detector 41 counts the 1's (or in an alternate embodiment the 0's) in the data stream received from the flash memory 10. The selector 33 identifies the read data as being user read data or as being nuisance read data in response to the output from the Hamming weight detector 41. The nuisance data is differentiated from user data for each block by examination of the average Hamming weight of the block. In one embodiment, the hamming weight is determined for a block in binary form as a count of 1's of the data for the block. The receiver 31 includes a receiver control 35 that operates under control of the host processor 13 to align the data in blocks for reception in the flash memory controller 11.

The host processor 13 of FIG. 1 commands the flash memory controller 11 of FIG. 2 to control the memory 10 to write data in the memory 10 as stored data 20 and to read the stored data 20 from the memory 10.

Referring to FIG. 3, flash memory 10 of FIG. 2, in one embodiment, has the data 20 organized into sectors SEC_1, SEC_2, ..., SEC_s, ..., SEC_B where each sector is 4096 Byte and each sector is divided into 16 tiles T_0, T_1, T_2, ..., T_8, T_9, ..., T_14, T_15 of 256 Byte each (2048 bits).

In one embodiment, the nuisance data to be inserted by transmitter 21 of FIG. 2 has a nuisance data Hamming weight threshold, $N_{HWT}$, which is low. In one example, the nuisance data is all 0's data and therefore the nuisance data Hamming weight threshold, $N_{HWT}$, is 0. In such an embodiment, the user encoded data employs a user data Hamming weight threshold, $U_{HWT}$, which is a high value. In one example, the user data Hamming weight threshold, $U_{HWT}$, is 512. In that example, each user encoded data tile is guaranteed to have a Hamming weight of 512.

With the nuisance data Hamming weight threshold, $N_{HWT}$, a low value (0 in the example) and the user data Hamming weight threshold, $U_{HWT}$, a high value (512 in the example), a detection Hamming weight threshold, $D_{HWT}$, is established by the Hamming weight detector 41 of FIG. 2 with $N_{HWT} < D_{HWT} \leq U_{HWT}$. In one embodiment, the detection Hamming weight threshold, $D_{HWT}$, is set as 190. In an alternate embodiment, the detection Hamming weight threshold, $D_{HWT}$, is established with $N_{HWT} > D_{HWT} \geq U_{HWT}$ so that the nuisance data Hamming weight threshold, $N_{HWT}$, is a high value (512, for example) and the user data Hamming weight threshold, $U_{HWT}$, is a low value (0, for example).

In another embodiment, the memory device 1 of FIG. 1 has the nuisance stored data with a nuisance Hamming weight threshold range, $N_{HWT}(R1,R2)$, has the user stored data with a user Hamming weight threshold range, $U_{HWT}(R1,R2)$, and has the detection Hamming weight threshold range, $D_{HWT}(R1,R2)$, such that, $N_{HWT}(R1,R2) < D_{HWT}(R1,R2) < U_{HWT}(R1,R2)$.

In one example, the nuisance Hamming weight threshold range, $N_{HWT}(R1,R2)$, is 0 to 64 (R1=0, R2=64), the user Hamming weight threshold range, $U_{HWT}(R1,R2)$, is 256 to 512 (R1=256, R2=512) and the detection Hamming weight threshold range, $D_{HWT}(R1,R2)$, is 128 to 192 (R1=128, R2=512).

In an embodiment where the thresholds are established for the user data as 512 and the nuisance data as 0, the transmitter 21 of FIG. 2 stores all user data tiles T_0, T_1, T_2, ..., T_8, T_9, ..., T_14, T_15 of FIG. 3 into the flash memory 10 with all the user data Hamming weight threshold, $U_{HWT}$, values equal to 512. The nuisance data tile, N, has a nuisance data Hamming weight threshold, $N_{HWT}$, value equal to 0. With the nuisance data tile, N, inserted (for example, between user data tiles T2 and T8), the sequence of data tiles is T_0, T_1, T_2, ..., N, ..., T_8, T_9, ..., T_14, T_15.

The sequence of tiles T_0, T_1, T_2, ..., N, ..., T_8, T_9, ..., T_14, T_15 is the write data transmitted by the transmitter 21 of FIG. 2 and becomes the stored data 20. The receiver 31 of FIG. 2 reads the stored data 20 as the read data. The Hamming weight detector 41 determines the Hamming weight of each received data tile. If the Hamming weight is less than 190, the tile is detected as nuisance data tile. If the Hamming weight is greater than or equal to 190, the tile is detected as a user data tile. Accordingly, based on the Hamming weight detection of detector 41, selector 33 will distribute the user read data to register 32 and will distribute the nuisance read data to register 34. Specifically, user data tiles T_0, T_1, T_2, ..., T_8, T_9, ..., T_14, T_15 are stored in register 32 and nuisance data tile, N, is stored in register 34.

Errors can occur in transmitting, storing and receiving data during memory operations of the FIG. 1 and FIG. 2 system. Assuming a bit error rate of 1e-2, the probability of detecting a nuisance data tile as user data tile is 3.5e-268 and the probability of detecting a user data tile as a nuisance data tile is less than 1.1e-238. As such, the probability of making an error is extremely small. Specifically, the probability is very low that user stored data is erroneously detected as nuisance stored data or that nuisance stored data is erroneously detected as user stored data. Accordingly, the probability is very low that user stored data is confused with nuisance stored data.

In FIG. 3, the blocks of user data and nuisance data are, in one embodiment, formed of tiles of equal size. However, in other embodiments, user data and nuisance data are blocks of different sizes and the transmitter control 25 and the receiver control 35 correlate the blocks of different sizes.

In FIG. 4, the blocks of user data and nuisance data, in the form of tiles T_0, T_1, T_2, ..., T_8, T_9, ..., N, T_14, T_15 have different values of Hamming weights. In the example described, the user data for 2048 bit blocks has for first ones of the user blocks (T_0, T_2 and T_9) a first Hamming weight threshold, $U_{HWT1}$, which is less than 600 and has for second ones of the user blocks (T_1, T_8, T_14 and T_15,) a second Hamming weight threshold, $U_{HWT2}$, which is greater than 1400. With such an example, the nuisance data Hamming weight threshold, $N_{HWT}$, is selected such that it can be readily distinguished from the user Hamming weight thresholds, $U_{HWT1}$ and $U_{HWT2}$. In one example, the nuisance data Hamming weight threshold, $N_{HWT}$, is established to be in a range $N_{HWT}(R-1,R-2)$ greater than 900 and less than 1100, that is, R1=900 and R2=1100. In the example, the first Hamming weight threshold, $U_{HWT1}$, is established to be less than 600, that is, between 0 and 600, and hence is established in a first range $U_{HWT1}(R1-1,R1-2)$ where R1-1=0 and R1-2=600. In the example, the second Hamming weight threshold, $U_{HWT2}$, is established greater than 1400, that is between 1400 and 2048, and hence is established in a second range $U_{HWT2}(R2-1,R2-2)$ where R2-1=1400 and R2-2=2048. Accordingly, $U_{HWT1}(R1-1,R1-2) < N_{HWT2})(R2-1,R2-2) < U_{HWT2}(R2-1,R2-2)$, that is, the nuisance data Hamming weight threshold range, $N_{HWT}(R-1,R-2)$, is greater than first Hamming weight threshold range, $U_{HWT1}(R1-1,R1-2)$, and is less than the second Hamming weight threshold range, $U_{HWT2}(R2-1,R2-2)$.

In the FIG. 4 embodiment, the user Hamming weight thresholds, $U_{HWT1}$ and $U_{HWT2}$ are established within two ranges, 0 to 600 and 1400 to 2048. Of course, the number of ranges for user data can be one, two, three or more provided that the ranges are readily distinguished from the range or ranges of the nuisance data. Similarly, in the FIG. 4 embodiment, the nuisance data Hamming weight threshold range, $N_{HWT}(R-1,R-2)$, is a single range but the number of ranges for nuisance data can be one, two, three or more provided that the nuisance ranges are readily distinguished from the range or ranges of the user data. In the embodiments described, the Hamming weight detector 41 of FIG. 2 is implemented using a 1's counter for counting the 1's in blocks of the data stream. However, in alternate embodiments, the number of 0's can also be used to perform nuisance data insertion/detection in data streams to distinguish between user data and nuisance data. In such alternate embodiments, the Hamming weight detector 41 of FIG. 2 is implemented using a 0's counter.

Figure 5:
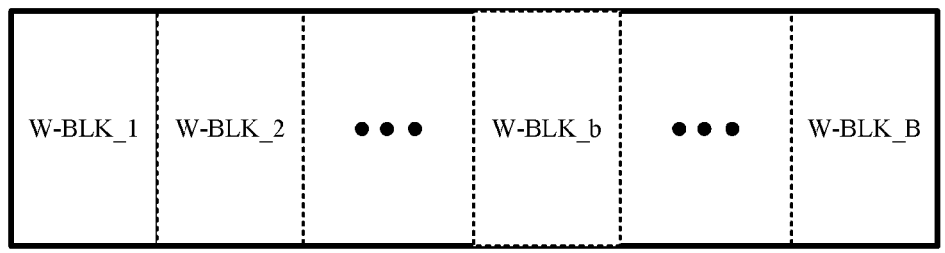
FIG. 5 depicts a block diagram representation of user write data used in the flash memory device of FIG. 1.

In FIG. 5, an example of user write data in register 22 of FIG. 2 includes write blocks W-BLK_1, W-BLK_2, . . . , W-BLK_b, . . . , W-BLK_B. The blocks are in one embodiment the same as the blocks of tiles described in connection with FIG. 3 or can be any other convenient size or sizes. Each of these blocks has the user data Hamming weight threshold, $U_{HWT}$, being a high value. In one example, the high value is 512 as described in connection with FIG. 3 or is any other convenient high value. The operation of the transmitter 21 of FIG. 2 is to select with selector 23 blocks of user data from register 22. The selection operation is under control of the transmitter control 25 which at a selected location in the sequence selects and inserts nuisance data, N-BLK_1, from register 24

Figure 6:
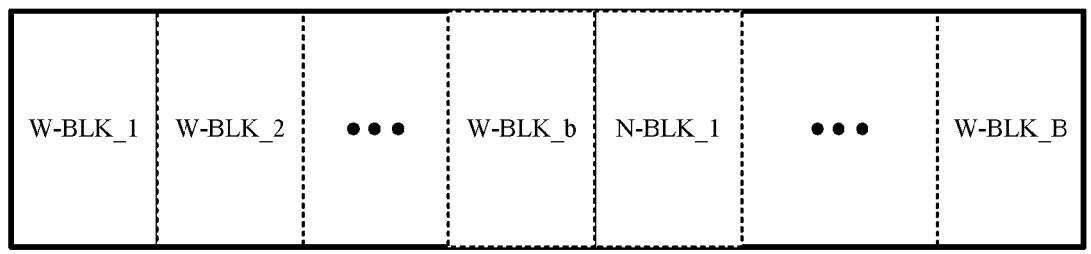
FIG. 6 depicts a block diagram representation of the user write data of FIG. 5 augmented with nuisance write data for storing in the flash memory device of FIG. 1.

In FIG. 6, the selected nuisance data in a block N-BLK_1 is selected by selector 23 and control 25 of FIG. 2 and is inserted into the sequence of blocks from user write data register 22. The insertion occurs after some user write block, W-BLK_b, so that the data written into flash memory 10 of FIG. 2 is the blocks W-BLK_1, W-BLK_2, . . . , W-BLK_b, N_BLK_1, . . . , W-BLK_B.

While any particular block location can be selected, by way of example, user write block W-BLK_10 (that is, b=10) is selected as the one to be followed by the nuisance block N-BLK_1. The nuisance block has the nuisance data Hamming weight threshold, $N_{HWT}$, which is readily distinguished from the user data. In one example, the nuisance data Hamming weight threshold is a low value (such as 0) when the user data Hamming weight threshold is a high value (such as 512) as described in connection with FIG. 3. Values are selected so that the user data Hamming weight threshold, $N_{HWT}$, and the nuisance data Hamming weight threshold, $N_{HWT}$, are readily distinguished by the Hamming weight detector 41 in FIG. 2.

Figure 7:
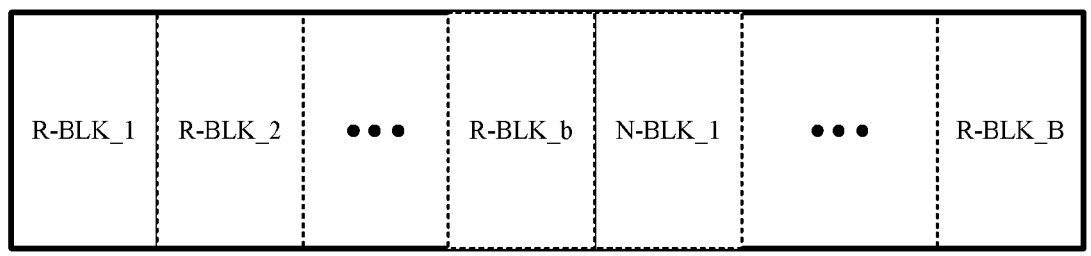
FIG. 7 depicts a block diagram representation of the user read data and nuisance read data read from the flash memory device of FIG. 1.
Figure 8:
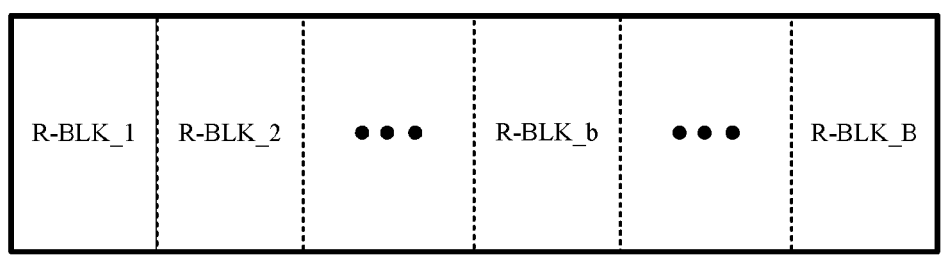
FIG. 8 depicts a block diagram representation of the user read data selected from the data of FIG. 7.

In FIG. 7, the data read from the flash memory 10 corresponding to the data of FIG. 6 is shown. The receiver of FIG. 2 operates to detect the Hamming weight of each block read. The Hamming weight of each block is compared with a detection Hamming weight threshold, $D_{HWT}$, to distinguish between the nuisance data Hamming weight threshold, $N_{HWT}$, and the user data Hamming weight threshold, $U_{HWT}$. The detection Hamming weight threshold, $D_{HWT}$, is set with $N_{HWT} < D_{HWT} \leq U_{HWT}$. In the example described in connection with FIG. 3, the detection Hamming weight threshold, $D_{HWT}$, is set as 190. With these values, the read blocks R-BLK_1, R-BLK_2, . . . , R-BLK_b, R-BLK_B are selected for storage in the user read data register 32 and the nuisance read data block N-BLK_1 is stored in nuisance data register 34.

While the invention has been particularly shown and described with reference to preferred embodiments thereof it will be understood by those skilled in the art that various changes in form and details typically is made therein without departing from the scope of the invention.

What is claimed is:

1. A memory device comprising:
  a memory including a plurality of nonvolatile memory cells for storing data to provide stored data, wherein the memory cells are addressable for reading and writing the stored data where the stored data includes (i) user stored data and (ii) nuisance stored data; and
  a memory controller including
    a transmitter for transmitting write data for storage as the stored data in the memory, wherein the transmitter includes a selector for (i) selection of user write data for storage as the user stored data in the memory and (ii) selection of nuisance write data for storage as the nuisance stored data in the memory, and
    a receiver for receiving the stored data from the memory as read data, wherein the read data includes (i) the user stored data and (ii) the nuisance stored data, wherein the receiver includes a Hamming weight detector for detecting Hamming weights of the read data, and wherein the Hamming weights are used to distinguish the user stored data from the nuisance stored data in accordance with stored Hamming weight threshold data, wherein the Hamming weight threshold data is selected such that a probability of erroneously identifying nuisance data or user data is minimized.

2. The memory device of claim 1, wherein the Hamming weight detector is a count detector for counting 1's in the read data to determine the Hamming weights.

3. The memory device of claim 1, wherein the Hamming weight detector is a count detector for counting 0's in the read data to determine the Hamming weights.

4. The memory device of claim 1, wherein the nuisance stored data has a nuisance Hamming weight threshold, $N_{HWT}$, and the user stored data has a user Hamming weight threshold, $U_{HWT}$, and wherein the nuisance Hamming weight threshold, $N_{HWT}$, is different from the user Hamming weight threshold, $U_{HWT}$, to enable the Hamming weight detector to distinguish the user stored data from the nuisance stored data.

5. The memory device of claim 4, wherein the nuisance Hamming weight threshold, $N_{HWT}$, is a first value represented by a first count and the user stored data Hamming weight threshold, $U_{HWT}$, is a second value represented by a second count.

6. The memory device of claim 5, wherein the first count is a high number and the second count is a low number.

7. The memory device of claim 5, wherein the first count is a low number and the second count is a high number.

8. The memory device of claim 1, wherein the nuisance stored data has a nuisance Hamming weight threshold, $N_{HWT}$, and the user stored data has a user Hamming weight threshold, $U_{HWT}$, and wherein the Hamming weight detector has a detection Hamming weight threshold, $D_{HWT}$, such that $N_{HWT} < D_{HWT} \leq U_{HWT}$.

9. The memory device of claim 1, wherein the nuisance stored data has a nuisance Hamming weight threshold range, $N_{HWT}(R1,R2)$, and the user stored data has a user Hamming weight threshold range, $U_{HWT}(R1,R2)$, and wherein the Hamming weight detector has a detection Hamming weight threshold range, $D_{HWT}(R1,R2)$, such that, $N_{HWT}(R1,R2) < D_{HWT}(R1,R2) < U_{HWT}(R1,R2)$.

10. The memory device of claim 9, wherein the nuisance Hamming weight threshold range, $N_{HWT}(R1,R2)$, the user Hamming weight threshold range, $U_{HWT}(R1,R2)$, and the detection Hamming weight threshold range, $D_{HWT}(R1,R2)$, are selected such that the user stored data is distinguishable from the nuisance stored data.

11. The memory device of claim 1, wherein the nuisance stored data has a nuisance Hamming weight threshold range, $N_{HWT}(R1,R2)$, the user stored data has a first user Hamming weight threshold range, $U_{HWT1}(R1-1,R1-2)$ and a second user Hamming weight threshold range, $U_{HWT2}(R2-1,R2-2)$, and wherein the Hamming weight detector uses the nuisance Hamming weight threshold range, $N_{HWT}(R1,R2)$ to distinguish the nuisance stored data from the user stored data with, $U_{HWT1}(R1-1,R1-2) < N_{HWT}(R-1,R-2) < U_{HWT2}(R2-1,R2-2)$.

12. The memory device of claim 11, wherein the nuisance Hamming weight threshold range, $N_{HWT}(R1,R2)$, the first user Hamming weight threshold range, $U_{HWT1}(R1-1,R1-2)$, the second user Hamming weight threshold range, $U_{HWT2}(R2-1,R2-2)$, are selected such that the user stored data is distinguishable from the nuisance stored data.

13. The memory device of claim 1, wherein the stored data is organized in blocks, such that:
blocks for the user stored data have a user data Hamming weight threshold, $U_{HWT}$;
blocks for the nuisance stored data have a nuisance Hamming weight threshold, $N_{HWT}$;
the user Hamming weight threshold, $U_{HWT}$, is different from the nuisance Hamming weight threshold, $N_{HWT}$; and
the Hamming weight detector has a detection Hamming weight threshold, $D_{HWT}$, having a value between the user Hamming weight threshold, $U_{HWT}$, and the nuisance Hamming weight threshold, $N_{HWT}$,
and for each block,
the Hamming weight detector detects a block Hamming weight of the block and compares the block Hamming weight with the detection Hamming weight threshold, $D_{HWT}$,
whereby for the block Hamming weight less than $D_{HWT}$, the block is a nuisance block, and
whereby for the block Hamming weight greater than $D_{HWT}$, the block is a user block.

14. The memory device of claim 1, wherein the stored data is organized in blocks, such that:
blocks for the user stored data have a user data Hamming weight threshold, $U_{HWT}$;
blocks for the nuisance stored data have a nuisance Hamming weight threshold, $N_{HWT}$;
the user Hamming weight threshold, $U_{HWT}$, is different from the nuisance Hamming weight threshold, $N_{HWT}$; and
the Hamming weight detector has a detection Hamming weight threshold, $D_{HWT}$, having a value between the user Hamming weight threshold, $U_{HWT}$, and the nuisance Hamming weight threshold, $N_{HWT}$,
and for each block,
the Hamming weight detector detects a block Hamming weight of the block and compares the block Hamming weight with the detection Hamming weight threshold, $D_{HWT}$,
whereby for the block Hamming weight greater than $D_{HWT}$, the block is a nuisance block, and
whereby for the block Hamming weight less than $D_{HWT}$, the block is a user block.

15. The memory device of claim 1, wherein:
the user write data includes a plurality of user write blocks W-BLK_1, W-BLK_2, ..., W-BLK_b, ..., W-BLK_B;
the nuisance write data includes one or more nuisance write blocks including nuisance write block N-BLK_1;
the transmitter includes a selector for selecting from the user write blocks the user write blocks W-BLK_1, W-BLK_2, ..., W-BLK_b, ..., W-BLK_B and from the nuisance write blocks the nuisance write block N-BLK_1 to provide stored blocks W-BLK_1, W-BLK_2, ..., W-BLK_b, N-BLK_1, ..., W-BLK_B in the memory;
the Hamming weight detector receives the stored blocks from the memory as the read data where the read data includes read blocks R-BLK_1, R-BLK_2, ..., R-BLK_b, N-BLK_1, ..., R-BLK_B and the Hamming weight detector determines a Hamming weight for each of the read blocks; and
the receiver includes a selector for selecting, for each read block, a user read block or a nuisance read block as a function of the Hamming weight of the read block.

16. In a memory device having a memory including a plurality of nonvolatile memory cells for storing data to provide stored data, wherein the memory cells are addressable for reading and writing the stored data where the stored data includes (i) user stored data and (ii) nuisance stored data, a method of controlling the memory comprising:
transmitting write data for storage as the stored data in the memory, wherein the transmitting includes (i) selection of user write data for storage as the user stored data in the memory and (ii) selection of nuisance write data for storage as the nuisance stored data in the memory; and
receiving the stored data from the memory as read data, wherein the read data includes (i) the user stored data and (ii) the nuisance stored data, wherein the receiving includes detecting Hamming weights of the read data, and wherein the Hamming weights are used to distinguish the user stored data from the nuisance stored data in accordance with stored Hamming weight threshold data, wherein the Hamming weight threshold data is selected such that a probability of erroneously identifying nuisance data or user data is minimized.

17. The method of claim 16, wherein the Hamming weight detection counts 1's or 0's in the read data to determine the Hamming weights.

18. The method of claim 16, wherein the nuisance stored data has a nuisance Hamming weight threshold range, $N_{HWT}$(R1,R2), the user stored data has a first user Hamming weight threshold range, $U_{HWT1}$(R1-1,R1-2), and a second user Hamming weight threshold range, $U_{HWT2}$(R2-1,R2-2), and wherein the Hamming weight detection uses the nuisance Hamming weight threshold range, $N_{HWT}$(R1,R2) to distinguish the nuisance stored data from the user stored data with, $U_{HWT1}$(R1-1,R1-2)<$N_{HWT}$(R-1,R-2)<$U_{HWT2}$(R2-1,R2-2).

19. The method of claim 18, wherein the nuisance Hamming weight threshold range, $N_{HWT}$(R1,R2), the first user Hamming weight threshold range, $U_{HWT1}$(R1-1,R1-2), the second user Hamming weight threshold range, $U_{HWT2}$(R2-1, R2-2), are selected such that the user stored data is distinguishable from nuisance stored data.

20. The method of claim 16, wherein the nuisance stored data has a nuisance Hamming weight threshold, $N_{HWT}$, and the user stored data has a user Hamming weight threshold, $U_{HWT}$, and wherein the Hamming weight detection has a detection Hamming weight threshold, $D_{HWT}$, such that $N_{HWT} < D_{HWT} \leq U_{HWT}$.

21. A memory device comprising:
a memory including a plurality of nonvolatile memory cells; and
a memory controller including
a transmitter configured to transmit data to be written in the plurality of nonvolatile memory cells of the memory, wherein the data comprises (i) user data and (ii) nuisance data, and
a receiver configured to receive the data previously written in the plurality of nonvolatile memory cells of the memory, wherein the data received by the receiver includes (i) the user data and (ii) the nuisance data, wherein the receiver includes a Hamming weight detector configured to distinguish the user data from the nuisance data according to a Hamming weight threshold, $D_{HWT}$, as follows
$N_{HWT} < D_{HWT} \leq U_{HWT}$,
wherein $N_{HWT}$ corresponds to a nuisance Hamming weight threshold of the nuisance data, and $U_{HWT}$ corresponds to a user Hamming weight threshold of the user data.

22. In a memory device having (i) a memory including a plurality of nonvolatile memory cells, and (ii) a memory controller including a transmitter and a receiver, a method of controlling the memory comprising:
   transmitting, by the transmitter, data to be written in the plurality of nonvolatile memory cells of the memory, wherein the data comprises user data and nuisance data; and
   receiving, by the receiver, the data previously written in the plurality of nonvolatile memory cells of the memory, wherein the data received by the receiver includes (i) the user data and (ii) the nuisance data; and distinguishing, via a Hamming weight detector included within the receiver, the user data from the nuisance data according to a Hamming weight threshold, $D_{HWT}$, as follows
   $N_{HWT} < D_{HWT} \leq U_{HWT}$,
   wherein $N_{HWT}$ corresponds to a nuisance Hamming weight threshold of the nuisance data, and $U_{HWT}$ corresponds to a user Hamming weight threshold of the user data.

* * * * *